United States Patent
Kanabar et al.

(10) Patent No.: US 9,673,994 B2
(45) Date of Patent: Jun. 6, 2017

(54) SYNCHROPHASOR DATA MANAGEMENT SYSTEMS AND METHODS

(71) Applicant: General Electric Company, Schenectady, NY (US)

(72) Inventors: Mitalkumar G. Kanabar, Markham (CA); Ilia Voloh, Thornhill (CA); Sridevi Mutnuri, Markham (CA); Ihab Hamour, Toronto (CA)

(73) Assignee: General Electric Company, Schenectady, NY (US)

( * ) Notice: Subject to any disclaimer, the term of this patent is extended or adjusted under 35 U.S.C. 154(b) by 576 days.

(21) Appl. No.: 14/159,229

(22) Filed: Jan. 20, 2014

(65) Prior Publication Data

US 2015/0207645 A1    Jul. 23, 2015

(51) Int. Cl.
*H04L 12/18*    (2006.01)
*G06F 19/00*    (2011.01)
(Continued)

(52) U.S. Cl.
CPC ...... *H04L 12/2854* (2013.01); *G01R 19/2513* (2013.01); *G05B 15/02* (2013.01);
(Continued)

(58) Field of Classification Search
CPC ....... Y02E 60/74; Y02E 60/728; Y04S 10/30; Y04S 10/265; G01D 4/002; H04L 12/2854; H04L 12/1836; G01R 19/2513
See application file for complete search history.

(56) References Cited

U.S. PATENT DOCUMENTS 6,662,124 B2    12/2003    Schweitzer, III et al.
6,845,333 B2    1/2005    Anderson et al.
(Continued)

FOREIGN PATENT DOCUMENTS

WO    2011140559 A1    11/2011

OTHER PUBLICATIONS

IEEE Standard for Synchrophasor Data Transfer for Power Systems C37.118.2, Dec. 2011, 53 pages.*
(Continued)

*Primary Examiner* — Thuy Dao
(74) *Attorney, Agent, or Firm* — Parks IP Law LLC

(57) ABSTRACT

One embodiment describes a non-transitory tangible computer-readable medium storing a plurality of instructions executable by a processor of an electronic device in a wide area monitoring system. The instructions include instructions to receive a synchro-command from the wide area monitoring system via a network interface, in which the synchro-command is time synchronized with a global clock by a time stamp encoded on the synchro-command; accept or reject the synchro-command with an input handler based at least in part on a sender ID and a receiver ID encoded on the synchro-command; schedule execution of a control command encoded on the synchro-command with a synchro-command manager based at least in part on a scheduler time encoded on the synchro-command; and execute the control command encoded on the synchro-command with the processor based at least in part on an application ID encoded on the synchro-command.

15 Claims, 6 Drawing Sheets

(51) Int. Cl.
  *H04L 12/28* (2006.01)
  *G05B 15/02* (2006.01)
  *G05F 1/66* (2006.01)
  *G01R 19/25* (2006.01)
  *H02J 13/00* (2006.01)

(52) U.S. Cl.
  CPC ............ *G05F 1/66* (2013.01); *H02J 13/0017* (2013.01); *Y02E 60/728* (2013.01); *Y02E 60/74* (2013.01); *Y02E 60/7807* (2013.01); *Y04S 10/265* (2013.01); *Y04S 10/30* (2013.01); *Y04S 40/12* (2013.01)

(56) References Cited

U.S. PATENT DOCUMENTS

| | | | |
|---|---|---|---|
| 7,126,800 | B2 | 10/2006 | Premerlani et al. |
| 7,444,248 | B2 | 10/2008 | Premerlani et al. |
| 7,630,863 | B2 | 12/2009 | Zweigle et al. |
| 8,321,162 | B2* | 11/2012 | Labuschagne ........ H02J 3/1878 702/60 |
| 8,405,944 | B2* | 3/2013 | Donolo ................ H02H 7/261 361/36 |
| 8,457,912 | B1* | 6/2013 | Wells .................... H02J 3/24 702/60 |
| 9,112,710 | B2* | 8/2015 | Taft ..................... H04L 12/1836 |
| 9,230,429 | B2* | 1/2016 | McKinley ............. G01D 4/002 |
| 9,293,949 | B2* | 3/2016 | Trudnowski ........ H02J 13/0006 |
| 9,369,269 | B2* | 6/2016 | Dionne ............. G01R 19/2513 |
| 2006/0224336 | A1 | 10/2006 | Petras et al. |
| 2009/0088990 | A1 | 4/2009 | Schweitzer, III et al. |
| 2009/0094259 | A1 | 4/2009 | Xu et al. |
| 2011/0047400 | A1* | 2/2011 | Blackmon ............. G06F 11/141 713/400 |
| 2011/0282508 | A1 | 11/2011 | Goutard et al. |
| 2012/0082159 | A1* | 4/2012 | Taft ..................... H04L 12/1836 370/390 |
| 2012/0243416 | A1* | 9/2012 | Hussain ............. H02J 13/0024 370/241 |
| 2013/0158907 | A1 | 6/2013 | Guo et al. |
| 2013/0193951 | A1 | 8/2013 | Korovin et al. |
| 2013/0218359 | A1 | 8/2013 | Dadash Zadeh et al. |
| 2013/0246427 | A1* | 9/2013 | Murata ............. G06F 17/30598 707/737 |
| 2013/0346419 | A1 | 12/2013 | Hewitt et al. |
| 2014/0229127 | A1* | 8/2014 | Ren ..................... H02H 3/40 702/59 |

OTHER PUBLICATIONS

Hazra et al., Stream computing based synchrophasor application for power grids, Nov. 2011, 7 pages.*
Weiss et al., A multi-user network testbed for wide-area monitoring and control of power systems using distributed synchrophasors, May 2013, 2 pages.*
Hogan et al., Towards effective clustering techniques for the analysis of electric power grids, Nov. 2013, 8 pages.*
IEEE Standard for Synchrophasors for Power Systems, IEEE 1344, 1995.
IEEE Standard for Synchrophasors for Power Systems, IEEE C37.118.1-2005.
IEEE Draft Standard for Synchrophasors for Power Systems, IEEE C37.118.1, under construction in 2011.
IEEE Draft Standard for Synchrophasors Data Transfer for Power Systems, IEEE C37.118.2, under construction in 2011.
IEC standard for Communication networks and systems for power utility automation—Part 90-5: Use of IEC 61850 to transmit synchrophasors information according to IEEE c37.118, IEC 61850-90-5, TR, under construction in 2011.
R. Schulz, et al. "Application of Fast Phasor Measurements on Utility Systems," in IEEE proc. of Power Industry Computer Application Conference, 1989.
Bharat Bhargava, "Synchronized Phasor Meaurement System Project at Southern California Edison Co.," IEEE 1999.
W. Keith Steinmetz, "Sampling ACE Data for NERC CPC Surveys," IEEE ISSN0895-0156/93, 1993.
"IEEE Standard for Synchrophasor Data Transfer for Power Systems Std C37.118.2-2011", IEEE Power & Energy Society, Dec. 28, 2011.
A PCT Search Report and Written Opinion issued in connection with corresponding PCT Application No. PCT/US2015/011673 on May 19, 2015.
International Search Report in corresponding application No. PCT/US2015/011673, mailed Jun. 30, 2015.
The Institution of Electrical Engineers, Stevenage, GB; Dec. 28, 2011 (Dec. 28, 2011), "IEEE Standard for Synchrophasor Data Transfer for Power Systems", XP002737940.

* cited by examiner

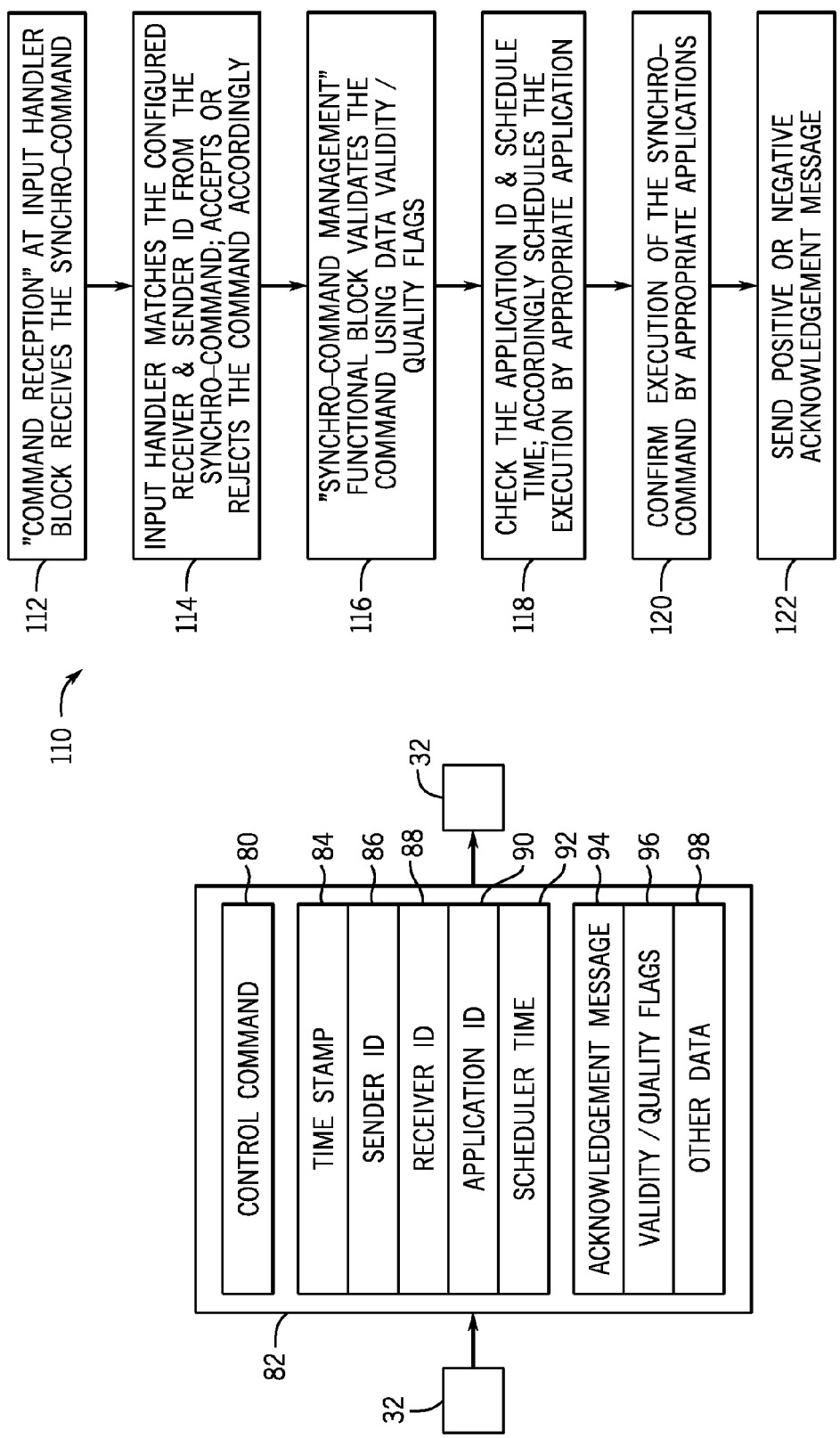

SYNCHROPHASOR DATA MANAGEMENT SYSTEMS AND METHODS

BACKGROUND

The subject matter disclosed herein relates to Wide Area Monitoring Systems (WAMS) and more specifically, to communication within the WAMS.

Generally, a Wide Area Monitoring System (WAMS) may be utilized to monitor large geographically distributed systems, such as an electrical grid. Specifically, a WAMS may include a plurality of substations located at various geographic locations of the distributed system. For example, the substations may enable the monitoring and/or metering of the distributed system by measuring parameters, such as device status, frequency, voltage, current, or power, and determine synchrophasor datasets based on the measured parameters. The synchrophasor datasets may then be transmitted and concentrated, for example at another substation or control center, to enable more centralized monitoring of the various geographic locations of the distributed system.

In addition, the WAMS may also include other features such as protection and control features. For example, based on the concentrated synchrophasor datasets, commands may be transmitted to the substations to perform specific actions, such as opening or closing a circuit breaker. Accordingly, it would be beneficial to improve the communication among devices in the WAMS.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

A first embodiment describes a device in a wide area monitoring system including a processor that initiates a synchro-command when a triggering event is detected; a synchro-command manager that encodes a control command on the synchro-command, in which the control command is based at least in part on the triggering event; and an output handler that encodes a time stamp, an application ID, a scheduler time, a sender ID, and a receiver ID on the synchro-command, and to output the synchro-command to enable sending the synchro-command to a second device in the wide area monitoring.

A second embodiment describes a non-transitory tangible computer-readable medium storing a plurality of instructions executable by a processor of an electronic device in a wide area monitoring system. The instructions include instructions to receive a synchro-command from the wide area monitoring system via a network interface, in which the synchro-command is time synchronized with a global clock by a time stamp encoded on the synchro-command; accept or reject the synchro-command with an input handler based at least in part on a sender ID and a receiver ID encoded on the synchro-command; schedule execution of a control command encoded on the synchro-command with a synchro-command manager based at least in part on a scheduler time encoded on the synchro-command; and execute the control command encoded on the synchro-command with the processor based at least in part on an application ID encoded on the synchro-command.

A third embodiment describes a device in a wide area monitoring system that includes a synchrophasor measurement unit that generates synchrophasor datasets based at least in part on measurements collected by power equipment coupled to the device. The device further includes a synchrophasor data archive that stores a generated synchrophasor dataset and a configuration of the synchrophasor measurement unit corresponding with when the synchrophasor dataset was generated, and that retrieves and sends the stored synchrophasor dataset and configuration to the synchrophasor measurement unit in response to a data retrieval control command, wherein the data retrieval control command identifies the stored synchrophasor dataset.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 5 is a block diagram illustrating an embodiment of data included in a synchro-command, in accordance with an embodiment;

FIG. 6 is a flowchart illustrating a process for receiving and executing a synchro-command in the device of FIG. 3, in accordance with an embodiment;

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure includes systems and methods for improving the communication between devices in a Wide Area Monitoring System (WAMS). More specifically, WAMS are often used to monitor large systems (e.g., with sub-cycle resolution), such as power systems distributed over large geographical areas (e.g., electrical grid). In some embodiments, WAMS may allow for functionality such as metering, protection, and/or control. Accordingly, one embodiment describes a device in a WAMS that includes an input handler to receive a synchro-command from a second device in the WAMS, in which the synchro-command is time synchronized with a global clock by a time stamp encoded on the synchro-command, and to accept or reject the synchro-command based at least in part on a sender ID and a receiver ID encoded on the synchro-command. The device additionally includes a syncho-command manager to receive an accepted synchro-command from the input handler, and to schedule execution of a control command encoded on the synchro-command based at least in part on a scheduler time encoded on the synchro-command. The device further includes a processor that executes the control command encoded on the synchro-command based at least in part on an application ID encoded on the synchro-command. As used herein, "control command" is intended to describe a command to perform a control action. In other words, devices within the WAMS may utilize time synchronized commands (i.e., synchro-commands) to enable more intelligent processing of control commands and synchronization of various devices in the WAMS.

Figure 1:
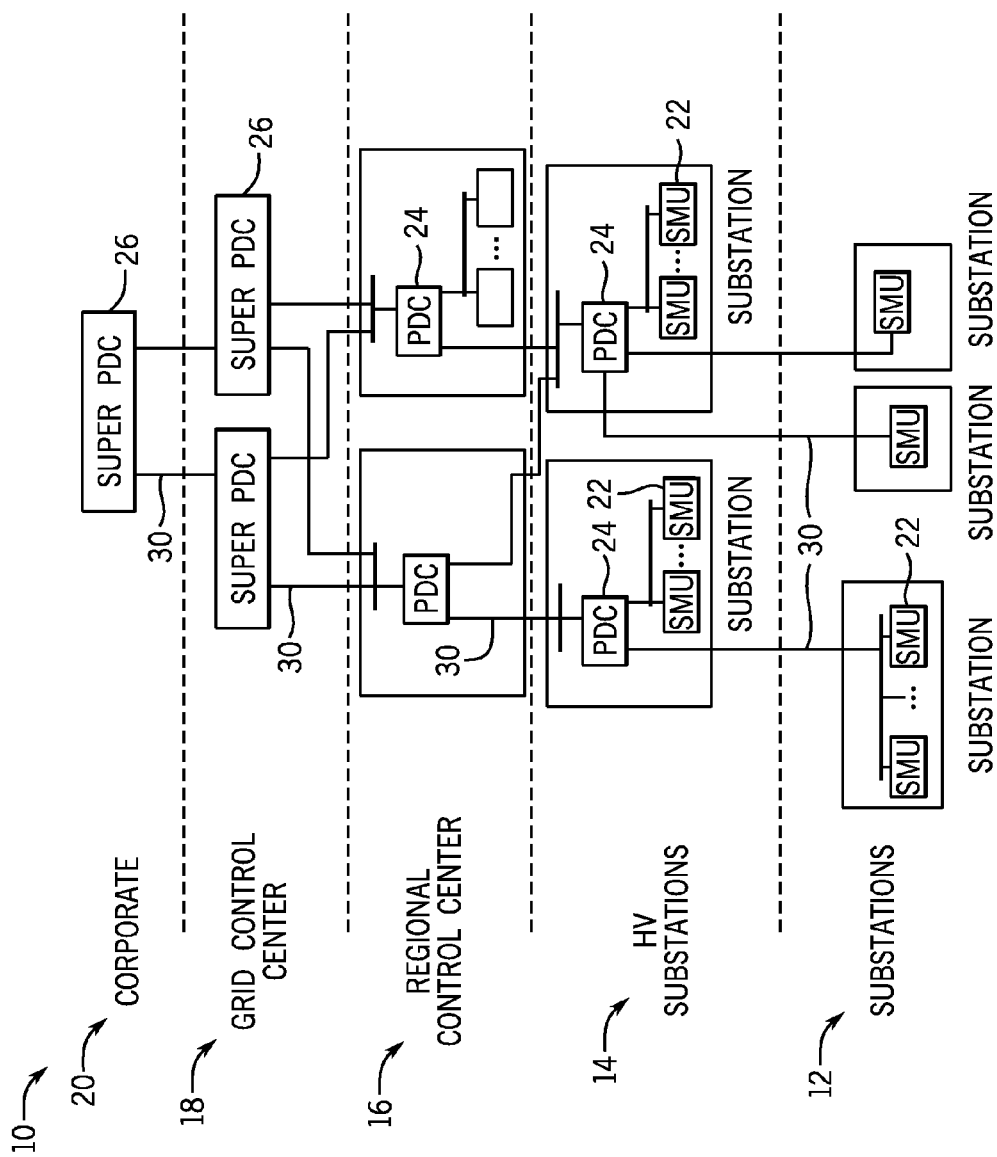
FIG. 1 is a schematic diagram illustrating a Wide Area Monitoring System (WAMS), in accordance with an embodiment.

By way of introduction, FIG. 1 depicts an embodiment of a WAMS 10. In the depicted embodiment, the WAMS 10, is a tiered system that includes multiple tiers, such as substations 12, high voltage (HV) substations 14, regional control centers 16, grid control centers 18, and a corporate (e.g., central) control center 20. Generally, data (e.g., measurements) may be gathered in substations 12 or 14 and centralized at more the control centers 16, 18, or 20. As should be appreciated, a more centralized monitoring system may also be utilized to consolidate some of the intermediate tiers (e.g., regional control centers 16 and/or grid control centers 18 into the corporate control center 20). Additionally, in other embodiments, the WAMS 10 may be distributed or decentralized.

As depicted, the WAMS 10 includes various devices including synchrophasor measurement units (SMU) 22, phasor data concentrators (PDC) 24, and super phasor data concentrators (super PDC) 26. More specifically, each substation 12 and HV substation 14 includes SMUs 22 that measure parameters such as device state, frequency, voltage, current, and power (e.g., synchrophasor measurements). In some embodiments, the SMU 22 may be included in a relay such as a N60 Network Stability and Synchrophasor Measurement System, available from General Electric Co., of Schenectady, N.Y. Based on the measured parameters, each SMU 22 determines synchrophasor datasets and transmits the datasets to the PDCs 24 via a network 30, such as a Local Area Network (LAN) or a Wide Area Network (WAN). As used herein, "synchrophasor datasets" include measured synchrophasor data and corresponding analog values, digital statuses, control bits, and the like. In some embodiments, the PDC 24 may be a Multilin P30 Phasor Data Concentrator, available from General Electric Co., of Schenectady, N.Y.

After the PDCs 24 concentrate the synchrophasor datasets, the PDCs 26 may similarly transmit the concentrated datasets to other PDCs 24 or to super PDCs 26 via the network 30. Accordingly, this allows the synchrophasor datasets to be concentrated for presentation and analysis in a centralized location, such as in a control center (e.g., regional control center 16, grid control center 18, and/or corporate control center 20).

Furthermore, control commands may be transmitted to and from the SMUs 22 via the network 30. Specifically, the commands may instruct an SMU 22 to perform a certain operation or to control power equipment, such as breakers, transformers, switches, motors, or generators, coupled to the SMU 22. For example, an SMU 22 may receive a control command instructing the SMU 22 to transmit a certain amount of stored synchrophasor datasets. Similarly, an SMU 22 may receive a protection control command instructing the SMU 22 to trip a breaker. In this manner, the network 30 allow for both data (e.g., synchrophasor datasets) and commands (e.g., control commands) to be transmitted among various devices (e.g., SMUs 22, PDCs 24, or super PDCs 26) in the WAMS 10.

Figure 2:
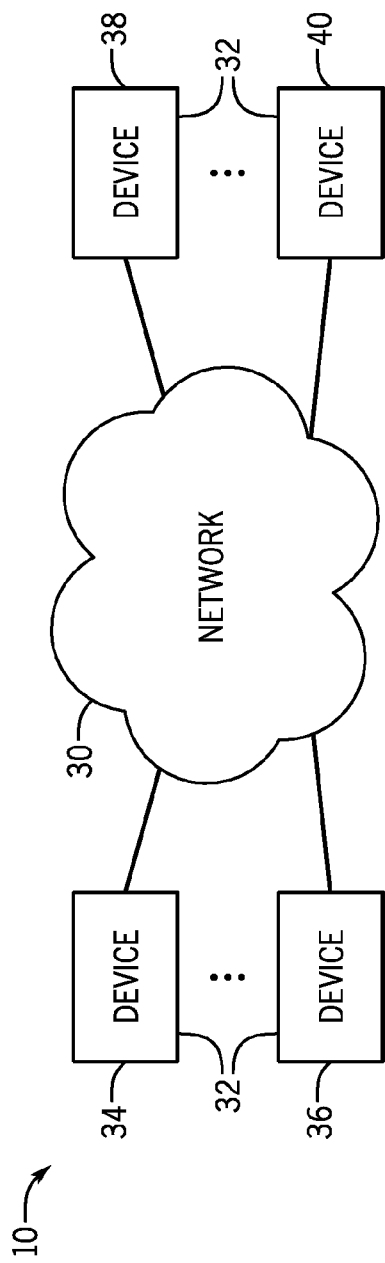
FIG. 2 is a block diagram illustrating the connectivity among devices in the WAMS of FIG. 1, in accordance with an embodiment.

Accordingly, as depicted in FIG. 2, a plurality of devices 32 are physically connected to the network 30. As will be described in more detail below, the techniques described herein enable a device 32 to communicate with each of the other devices 32 via the network 30. For example, a first device 34 may communicate (e.g., transmit data and/or commands) with a second device 36, a third device 38, or an n-th device 40 in the WAMS 10. Additionally, the techniques described herein enable the communication between devices 32 using a plurality of communication protocols. For example, the devices 32 may selectively communicate data and commands in accordance with Institute of Electrical and Electronics Engineers (IEEE) C37.118, International Electrotechnical Commission (IEC) 61850-90-5, or both.

Figure 3:
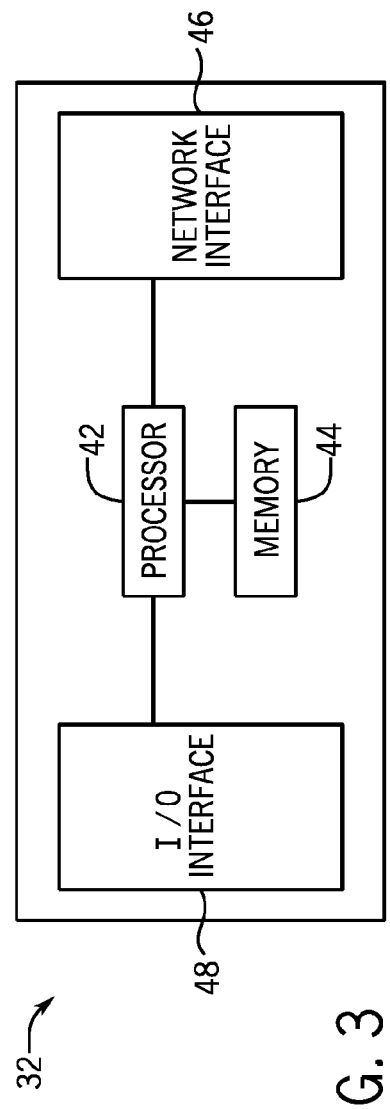
FIG. 3 is a block diagram illustrating components of a device of FIG. 2, in accordance with an embodiment.

Generally, the devices 32 (e.g., SMUs 22, PDCs 24, or super PDCs 26) in the WAMS 10 include the components depicted in FIG. 3. In some embodiments, the functionality of multiple devices 32 may be combined into a single device 32. In other words, a device may include a single SMU 22 or multiple SMUs 22.

As depicted, the device 32 includes one or more processor 42, memory 44, a network interface 46, and an I/O interface 48. The processor 42 may be programmed with and execute computer instructions stored in the tangible non-transitory memory 44, which may include flash drives, hard disk drives, optical disc drives, magneto-optical disc drives, and the like, to control the operation of the device 32. Additionally or alternatively, the processor 42 may be a hardware processor, such as an application-specific integrated circuit. In addition, the processor 42 is coupled to the network interface 46, which enables the processor 42 to control communication with the network 30. For example, the network interface 46 may utilize a serial connector, such as an Ethernet connector, to enable the device 32 (e.g., first device 34) to communicate data and/or commands with other devices 32 (e.g., second device 36, third device 38, or n-th device 40) via the network 30. Furthermore, the processor 42 is coupled to the I/O interface 48, which enables the processor 42 to control interaction with power equipment directly coupled to I/O interface 48. For example, the processor 42 in an SMU 22 (e.g., a device 32) may instruct a breaker (e.g., power equipment) to trip and/or receive measurements gathered by a sensor (e.g., power equipment).

Figure 4:
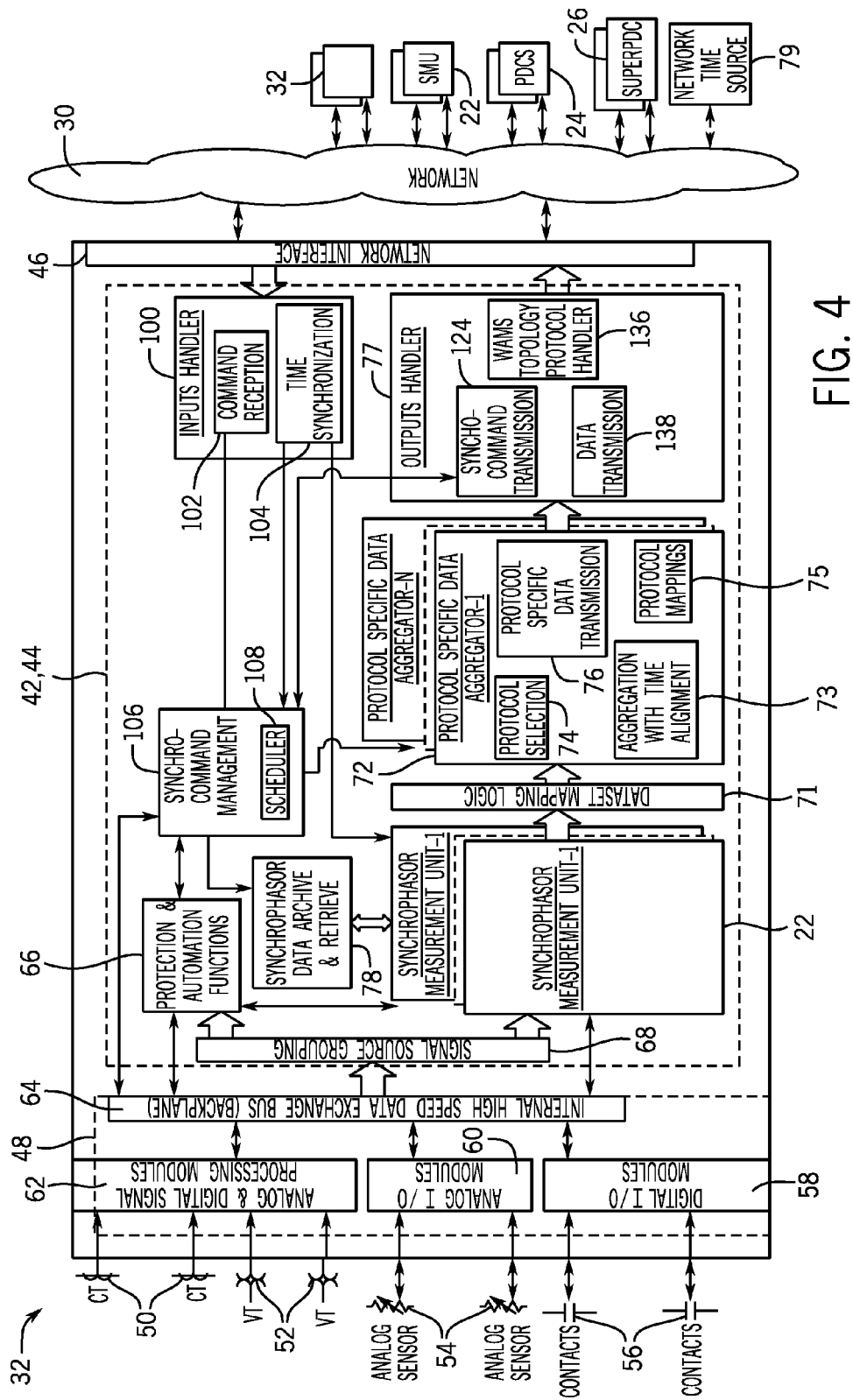
FIG. 4 is a process flow diagram illustrating processes within the device of FIG. 3, in accordance with an embodiment, in accordance with an embodiment.

FIG. 4 depicts an embodiment of the information flow within the device 32. As described above, the processor 42 and the memory 44 may be programmed to control the operations of the device 32. Accordingly, in FIG. 4, the processor 42 and memory 44 are depicted as including various function blocks, which each represents functions that may be performed by the processor 42 and/or memory 44. In other words, the memory 44 may include non-transitory computer-readable instructions (e.g., software), which when executed by the processor 42 may perform the functions described as function blocks. In other embodiments, the function blocks may represent dedicated hardware (e.g., ASIC) or a mix of dedicated hardware and software.

As described above, the I/O interface 48 directly couples the device 32 to power equipment. For example, in the depicted embodiment, the device 32 is communicatively coupled to current transformers 50, voltage transformers 52, analog sensors 54, and contacts 56. More specifically, the device 32 may receive data including magnitude, phase angle, and time relating to the voltage and current measured by the current transformers 50 and voltage transformers 52. The received data may then be utilized by the device 32 to generate phasor data (i.e., magnitude and phase angle), which may be time synchronized to generate synchrophasor data. In addition, the device 32 may receive analog sensor measurements from the analog sensors 54, such as a resistance temperature detector (RTD) or other external transducers. For example, the device 32 may receive an analog signal representative of a temperature measurement from an RTD (e.g., analog sensor 56). Furthermore, the device 32 may determine the status of the contacts 56 by receiving a digital signal representative of the status. For example, the device 32 may receive a "0" when a breaker is open and a "1" when the breaker is closed.

Accordingly, in the depicted embodiment, the I/O interface 48 includes a digital I/O module 58, an analog I/O module 60, an analog & digital signal processing module 62, and an internal high speed data exchange bus 64 (e.g., a backplane of the device 32). More specifically, the digital I/O module 58 provides an interface between the contacts 56 and the internal high speed data exchange bus 64. For example, in some embodiments, the digital I/O module 62 may validate a change in the status of the contact 58 by accounting for debounce time, which may facilitate ensuring only one status change is registered. Similarly, the analog I/O module 64 provides an interface between the analog sensors 54 and the internal high speed data exchange bus 64. For example, in some embodiments, the analog I/O module 60 may convert the received analog signals into a digital format for further processing in the device 32.

Additionally, as described above, the device 32 may generate synchrophasor data based on measurements (e.g., magnitude, phase angle, and time) received from the current transformers 50 and/or the voltage transformers 52. Accordingly, in some embodiments, to facilitate the generation of synchrophasor data, the analog & digital signal processing module 62 may provide calculated values based on the received measurements, such as total waveform root-mean-square level, fundamental frequency phasors, symmetrical components, or harmonics, to the internal high speed data exchange bus 64.

The processor 42 and/or memory 44 may then utilize the data on the data exchange bus 64 (e.g., contact status, sensor measurements, and transformer measurements) to perform functions. For example, the device 32 may perform protection and automation functions (function block 66). More specifically, the processor 32 may analyze the data on the data exchange bus 64 to detect conditions, such as undervoltage, overvoltage, underfrequency, overfrequency, or rate of change of frequency, and determine appropriate actions to take. In some embodiments, this may include instructing a breaker to shut off and/or informing other devices 32 of the condition.

Additionally, the device 32 may perform metering functions, such as generating synchrophasor datasets. To facilitate generating synchrophasor datasets, the signal sources may be grouped (function block 68). More specifically, the processor 42 may assign a specific current transformer 50 and a specific voltage transformer 52 to an SMU 22. In other words, the SMU 22 calculates synchrophasor data based on the measurements made by the assigned (e.g., specific) instrument transformers (e.g., 50 and 52). In addition, as depicted, the device 32 may include a plurality of SMUs 22, which is each assigned a specific voltage transformer 52 and current transformer 50. For example, a first SMU 22 may be assigned a first voltage transformer 52 and a first current transformer 50, and a second SMU 22 may be assigned a second voltage transformer 52 and a second current transformer 50. In some embodiments, the device 32 may include four or more SMUs 22.

As depicted, the synchrophasor datasets generated by each of the SMUs 22 may be mapped (function block 71) to a protocol specific dataset aggregator (function block 72) to facilitate communication in various protocols (e.g., IEEE C37.118 or IEC 61850-90-5). In some embodiments, the datasets may be mapped to protocol specific dataset aggregators 72 based on sampling rate, with datasets of the same sampling rate being mapped (i.e., assigned) to the same data aggregator 72. Accordingly, as depicted, the device 32 may include a plurality of protocol specific dataset aggregators 72.

More specifically, the protocol specific dataset aggregator 72 may aggregate the received datasets with time alignment (function block 73) and generate protocol specific datasets (e.g., IEEE C37.118 synchrophasor datasets, IEC 61850-90-5 synchrophasor datasets, or both). Accordingly, based on the protocol selected (function block 74), the aggregated datasets are mapped to form protocol specific datasets (function block 75). For example, if the IEEE C37.118 protocol is selected, the aggregated datasets are mapped to an IEEE C37.118 dataset. The protocol specific dataset may then be communicated based on the specifications of the selected protocol (function block 76) via an output handler 77 and the network interface 46. For example, an IEEE C37.118 dataset may be uni-cast, and an IEC 61850-90-5 may be multi-cast to other devices 32.

Additionally, the synchrophasor datasets calculated by the SMU 22 may also be archived for later retrieval (function block 78). In addition to storing the calculated synchrophasor datasets, the processor 42 and/or memory 44 may also store the configuration of the calculating SMU 22 to provide context for the synchrophasor datasets. The ability to archive and retrieve synchrophasor datasets and/or SMU configurations enables other devices 32 to request past data using synchro-commands described herein. For example, if a PDC 24 loses the synchrophasor data for a previous week, the PDC 24 may request the devices 32 to retrieve and retransmit the archived synchrophasor datasets for that week.

Additionally, the device 32, as described above, includes the network interface 46, which communicatively couples the device 32 to other SMUs 22, PDCs 24, super PDCs 26, and the like in the WAMS via the network 30. Additionally, the network interface 46 communicatively couples the device 32 to a network time source 79, which may facilitate the exchange of time synchronized control commands (i.e., synchro-commands) between the devices 32. As will be described in more detail below, synchro-commands may enable devices 32 to communicate and perform control actions in a synchronized manner. For example, a device 32 may prioritize control actions based on time sent and a plurality of devices 32 may synchronize execution of control actions based on a synchronized execution time.

In addition to a control command 80 (e.g., instruction to perform a control action), as depicted in FIG. 5, a synchro-command 82 may generally includes a time stamp 84, a receiver ID 86, a sender ID 88, an application (i.e., function) ID 90, a scheduler time 92, or any combination thereof. Additionally, in some embodiments, the synchro-command may be based on IEC protocol (e.g., IEC 61850-90-5), IEEE protocol (e.g., IEEE C37.118), the extended form of IEC 61850 based Generic Object Oriented Event (GOOSE), the IEC 61850-90-5 based Routable-Generic Object Oriented Event (R-GOOSE), or any other peer-to-peer mechanisms.

More specifically, the time stamp 84 may indicate when the synchro-command 82 was sent with reference to a global clock, such as the network time source 79. Additionally, the receiver ID 88 identifies the device 32 intended to receive the synchro-command 82 and the sender ID 86 identifies the sending device 32. In some embodiments, the receiver ID 88 and the sender ID 86 may be a media access control (MAC) address or another unique identifier for each device 32. The application ID 90 identifies the function within the device 32 that is intended to utilize the control command 80. For example, the application ID 90 may identify that a data retrieval control command 80 is intended for the synchrophasor data archive & retrieve function 78. Furthermore, the scheduler time 92 may indicate when to execute the control command 80. For example, the scheduler time 92 may indicate that the control command 80 is intended to be executed at a specific global time or that the control command 80 is intended to be executed after a specified time delay. Accordingly, the scheduler time 92 enables multiple devices 32 in the WAMS 10 to synchronize execution of control commands 80. For example, multiple devices may be instructed to execute a control command 80 at a specified global time. Moreover, in some embodiments, this is useful for testing purposes. More specifically, a synchro-command may simultaneously trigger multiple devices 32 together, for example to test the accuracy of synchrophasor data or compliance with the IEEE C37.118 standard.

Other types of data may also be included in the synchro-command 82 that facilitate certain functions of the device 32. As depicted, the synchro-command 82 includes an acknowledgement message 94, validity/quality flags 96, and other data 98. More specifically, the acknowledgement message 94 may indicate whether the control command 80 was successfully or unsuccessfully executed. In addition, the validity/quality flags 96 may indicate the quality of the time stamp 84 and the validity of the data included in the synchro-command 82. Other data 98 may include status information (e.g., open/closed), analog values (e.g., reference/threshold values), and application (i.e., function) specific data. For example, a synchro-command 82, including a data retrieval control command 80, may specify a period to retrieve (e.g., data retrieval start time and stop time).

Returning to FIG. 4, the network interface 46 communicates synchro-commands with other devices (e.g., 22, 24, 26, or 32) in the WAMS 10 via the network 30. As depicted, the network interface 46 communicates received synchro-commands 82 to the processor 42 and/or memory 44, and more specifically to an input handler (function block 100). Within the input handler 100, the synchro-command 82 is received (function block 102) and either accepted or rejected. For example, synchro-command reception 102 may include matching the receiver ID 88 to determine whether the synchro-command 82 is intended for the device 32 and accept or reject the synchro-command 82 based on the determination. In addition, the device 32 is time synchronized (function block 104). In some embodiments, time synchronization 104 may include synchronizing an internal clock in the device 32 with the network time source 79. In other words, the input handler 100 may receive a time synchronization input.

The synchro-command 82 and the synchronized time may then be communicated to a synchro-command manager (function block 106). Generally, the synchro-command manager 106 controls the execution of the synchro-command 82 based on the data included in the synchro-command 82. In the depicted embodiment, the synchro-command manager 106 may schedule (function block 108) the execution of control commands 80 based on the time stamp 84 and the scheduler time 92 included in the synchro-command 82. In some embodiments, this may include prioritizing between various synchro-commands 82. For example, the device 32 may receive a first synchro-command to open a breaker and later receive a second synchro-command to close the breaker from the same PDC 26. Based on the time stamps 84, the synchro-command manager 106 may recognize that the second synchro-command should be executed instead of the first synchro-command because it is likely that the more recently received synchro-command is more relevant to the current state of the device 32. Additionally, the synchro-command manager 106 may instruct a function (e.g., 66, 72, 77, or 78) to perform the control command 80 based on the application ID 90, analyze the validity/quality flags 96, trigger transmission of a synchro-command 82, such as an acknowledgement message 94, or any combination thereof. More generally, the synchro-command manager 106 may initiate and/or control other functions and processes within the device 32 (e.g., archive and retrieve synchrophasor datasets) as well as keep track of device events, logs, and/or statuses to better manage the control functions and processes.

FIG. 6 illustrates an embodiment of a process 110 utilized by the device 32 when a synchro-command 82 is received. The process 110 begins when the command reception 102 in the input handler 100 receives the synchro-command 82 (process block 112). As described above, the command reception 102 may receive the synchro-command 82 via the network interface 46. In the input handler 100, the receiver ID 88 and the sender ID 90 are matched, and accepted or rejected accordingly (process block 114). For example, the input handler 100 may match the receiver ID 88 with its own ID to determine whether the synchro-command 82 is intended for the device 32. Furthermore, the input handler 100 may match the sender ID 86 with a list of devices that the input handler 100 is allowed to receive synchro-commands from. In some embodiments, only if both the receiver ID 88 and the sender ID 86 are matched may the synchro-command 82 be accepted.

If the synchro-command 82 is accepted, it is communicated to the synchro-command manager 106. The synchro-command manager 106 then validates the synchro-command 82 based on validity/quality flags 96 (process block 116). The validity flag may indicate the validity of the data received in the synchro-command 82 and the quality flag may indicate the quality of the time stamp 84 included in the synchro-command 82. In some embodiments, the validation of the synchro-command 82 depends on the nature of the control command 80. For example, if the control command 80 is a protection function 66, the synchro-command manager 106 may utilize a higher validity/quality threshold than when the control command is a metering function (e.g., data archival and retrieval 78).

If the synchro-command 82 is validated, the synchro-command manager 106 schedules execution of the control command 82 by the appropriate application (i.e., function) based on the application ID 90 and scheduler time 92 (process block 118). As described above, the application ID 90 identifies the function intended to execute the control command 80 and the scheduler time 92 defines the time for execution.

After the scheduled execution time of the synchro-command 82, the synchro-command manager 106 determines whether the control command 80 was successfully executed by the intended application (i.e., function) (process block 120). Corresponding with the determination, the synchro-command manager 106 sends either a positive or a negative acknowledgement message 94 (process block 122). In some embodiments, the synchro-command manager 106 may instruct the output handler 77, and more specifically a synchro-command transmission function (function block 124), to transmit the acknowledgement message 94 as a synchro-command 82 via the network 30.

Figure 7:
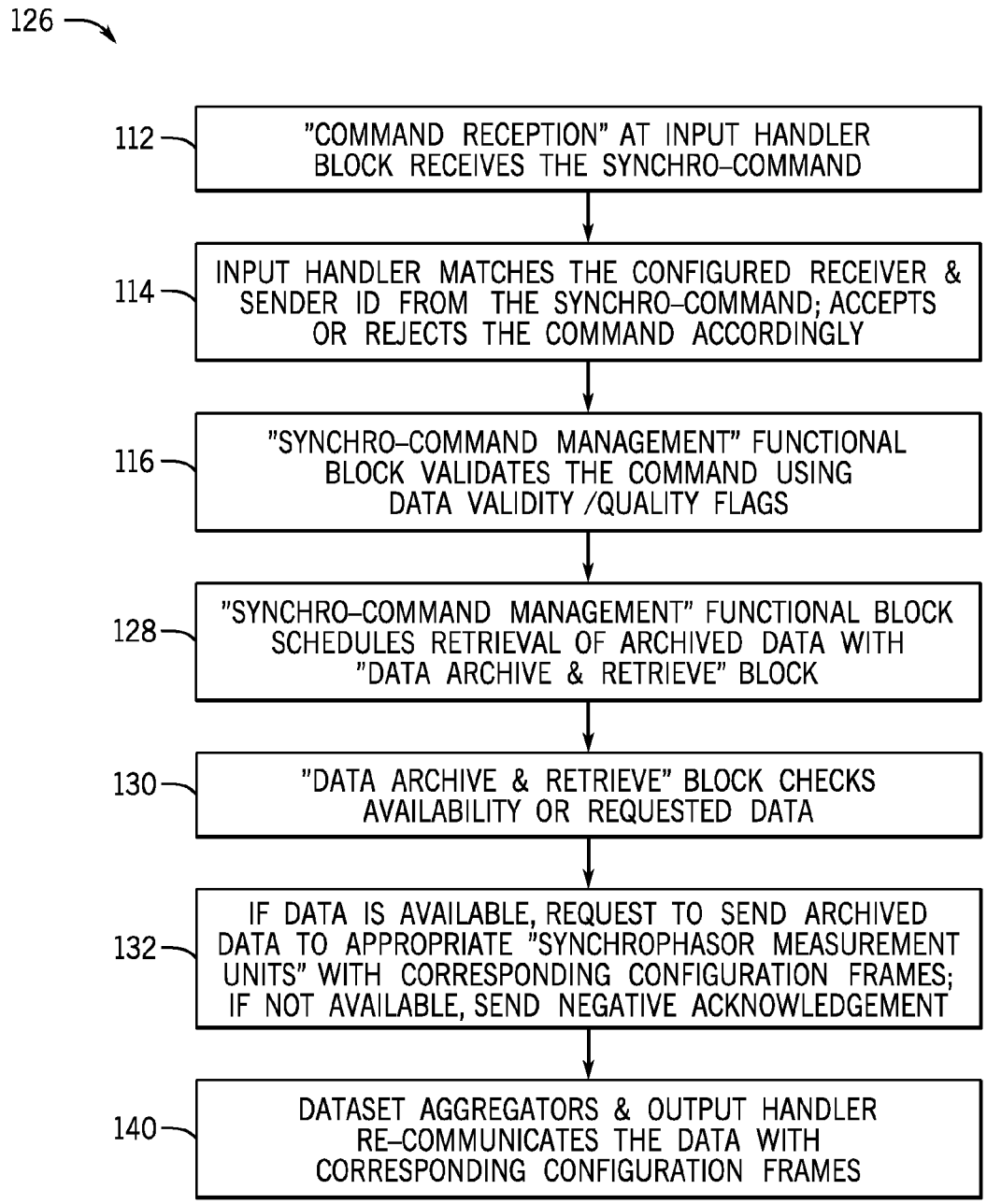
FIG. 7 is a flowchart illustrating a process for receiving and executing a "Data Retrieval" synchro-command in the device of FIG. 3, in accordance with an embodiment.

As described above, one specific synchro-command 82 includes a data retrieval control command 80. FIG. 7 illustrates an embodiment of a process 126 utilized by the device 32 when a synchro-command 82 with a data retrieval control command 80 is received. Similar to the process 110 described in FIG. 6, the process 126 begins when the command reception 102 receives the synchro-command 82 (process block 112) and the input handler 100 matches the receiver ID 88 and the sender ID 90 to accept or reject the synchro-command 82 accordingly (process block 114). If the synchro-command 82 is accepted, the synchro-command manager 106 then validates the synchro-command 82 based on validity/quality flags 96 (process block 116). If the synchro-command 82 is validated, the synchro-command manager 106 schedules execution of the control command 82, which in this embodiment includes scheduling retrieval of archived data by the archive & retrieve function 78 (process block 128).

In executing the retrieval, the archive & retrieve function 72 begins by checking the availability of the requested data (process block 130). For example, if a PDC 24 requests the synchrophasor datasets archived between January 1 and January 7, the archive & retrieve function 72 determines whether the datasets were in fact archived for that period. If the datasets are not available, the synchro-command manager 106 instructs a negative acknowledgement to be sent (process block 132), which in some embodiments is transmitted as a synchro-command 82 via the output handler 77.

If the datasets are available, a request is sent to an appropriate SMU 22 with the corresponding SMU configuration (process block 132). As described above, the SMU configuration may provide context for the archived datasets. Accordingly, in some embodiments, the appropriate SMU 22 may be the SMU 22 that originally generated the synchrophasor datasets requested. As described above, to enable communication using various protocols (e.g., IEEE C37.118 and IEC 61850-90-5), the synchrophasor datasets are transmitted to protocol specific dataset aggregators 72 to generate protocol specific datasets. In some embodiments, the protocol selection 74 is based on the topology of the WAMS 10. In other words, the protocol selected for the synchrophasor dataset depends on the protocol utilized in the receiving device 32. Accordingly, as depicted in FIG. 4, the output handler 77 includes a WAMS topology protocol handler 136 that determines the protocol of the devices 32 in the WAMS 10. The output handler 77 then transmits the protocol specific datasets (function block 138) over the network 30 to the requesting device 32 (process block 140).

Figure 8:
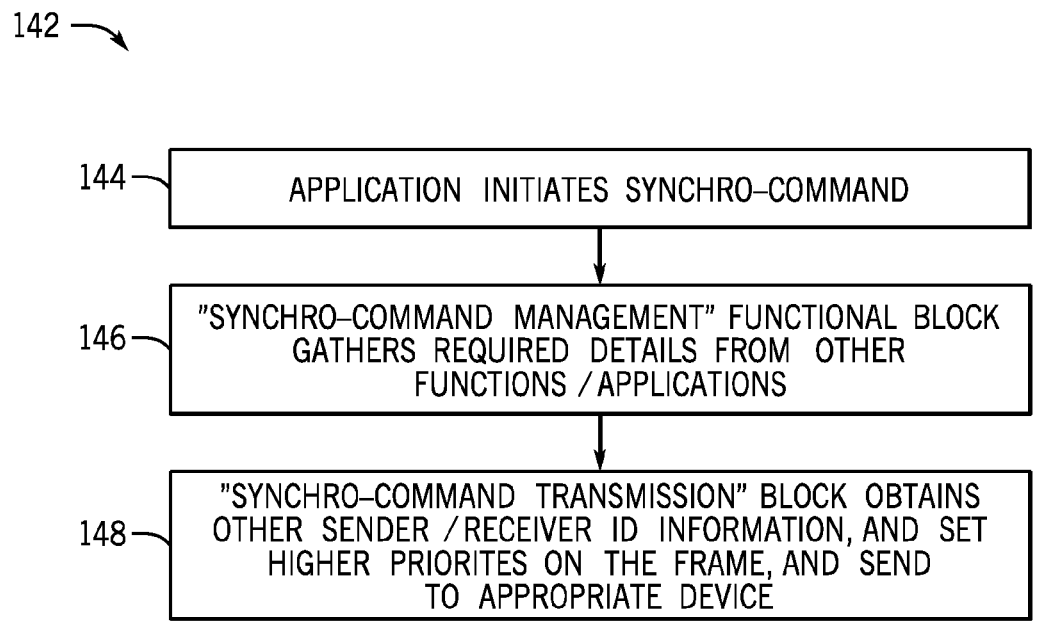
FIG. 8 is a flowchart illustrating a process for transmitting a synchro-command from the device of FIG. 3, in accordance with an embodiment.

In addition to receiving synchro-commands 82, the device 32 may also send synchro-commands 82. For example, as described above, the device 32 may transmit acknowledgement messages 94 as synchro-commands 82. Accordingly, FIG. 8 illustrates a process 142 utilized by the device 32 when transmitting a synchro-command 82. The process 142 begins when an application (i.e., function) initiates a synchro-command 82 (process block 144). In some embodiments, this may include detecting a triggering event such as undervoltage, overvoltage, underfrequency, or overfrequency. For example, when the protection & automation function 66 detects such an event, it may initiate a synchro-command 82 to inform other devices 32.

Once the synchro-command is initiated, the synchro-command manager 106 begins gathering the details (i.e., data) that is intended to be included in the synchro-command 82 from other functions (process block 146). In some embodiments, this may include determining a control command 80 to be included in the synchro-command 82. For example, the protection & automation function 32 may determine that breakers in other device 32 should be tripped.

The output handler 77, and more specifically the synchro-command transmission 124, then gathers the remaining data to be included in the synchro-command 82 (process block 148). In some embodiments, this may include gathering the time stamp 84, the sender ID 86, the receiver ID 88, the application ID 90, the scheduler time 92, or any combination thereof. Furthermore, the output handler 77 may set a priority for the synchro-command 82. For example, the output handler 77 may set a high priority for a protection synchro-command and a lower priority for a metering synchro-command. After all the data to be included in the synchro-command is gathered, the synchro-command 82 is transmitted to the appropriate device 32 (process block 148).

Technical effects of the present disclosure include providing systems and methods that improve the communication between devices in a wide area monitoring system (WAMS). More specifically, time synchronized commands (i.e., synchro-commands) may be utilized for communication to enable more intelligent processing of control commands and synchronization of various devices in the WAMS. For example, the device may look at the time stamp of various synchro-commands to facilitate determining which synchro-command should be executed. Additionally, multiple devices may simultaneously execute the synchro-command based on the scheduler time, which may be useful for testing purposes.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A non-transitory computer-readable medium comprising instructions that, when executed by a processor of an electronic device in a wide area monitoring system, cause the processor to:
   accept or reject a synchro-command, after receiving the synchro-command from the wide area monitoring system via a network interface, wherein the synchro-command is time synchronized with a global clock by a time stamp encoded on the synchro-command, wherein the acceptance or rejection of the synchro-command is based at least in part on a sender ID and a receiver ID encoded on the synchro-command;
   schedule execution of a control command encoded on the synchro-command based at least in part on a scheduler time encoded on the synchro-command; and
   execute the control command encoded on the synchro-command based at least in part on an application ID encoded on the synchro-command.

2. The non-transitory computer-readable medium of claim 1, comprising instructions that, when executed by a processor of an electronic device in a wide area monitoring system, cause the processor to:
   retrieve and send a stored synchrophasor dataset and a stored configuration of a synchrophasor measurement unit to the synchrophasor measurement unit in response to a data retrieval control command encoded on the synchro-command, wherein the configuration of the synchrophasor measurement unit corresponds with a time when the synchrophasor dataset was generated.

3. The non-transitory computer-readable medium of claim 1, wherein the instruction to schedule execution of the control command comprises an instruction to prioritize scheduling of control command based at least in part on a time stamp encoded on the synchro-command.

4. The non-transitory computer-readable medium of claim 1, wherein the instruction to schedule execution of the control command based at least in part on the scheduler time enables synchronized execution of the control command in various devices in the wide area monitoring system.

5. The non-transitory computer-readable medium of claim 1, comprising instructions that, when executed by the processor, cause the processor to:
   generate synchrophasor datasets in a synchrophasor measurement unit based at least in part on measurements received from power equipment coupled to the synchrophasor measurement unit; and
   store the generated synchrophasor datasets and configuration of the synchrophasor measurement unit.

6. The non-transitory computer-readable medium of claim 5, comprising instructions that, when executed by the processor, cause the processor to:
   time align and aggregate the synchrophasor datasets; and
   map the synchrophasor datasets to protocol specific datasets.

7. A device in a wide area monitoring system, comprising:
   a processor; and
   a memory comprising instructions that, when executed by the processor, cause the processor to:
   store a generated synchrophasor dataset and a configuration of a synchrophasor measurement unit corresponding with when the synchrophasor dataset was generated, wherein the synchrophasor measurement unit is configured to generate synchrophasor datasets based at least in part on measurements collected by power equipment coupled to the device;
   retrieve and send the stored synchrophasor dataset and configuration to the synchrophasor measurement unit in response to a data retrieval control command, wherein the data retrieval control command identifies the stored synchrophasor dataset;
   utilize a synchro-command received from a second device in the wide area monitoring system, wherein the synchro-command is time synchronized with a global clock by a time stamp encoded on the synchro-command;
   determine whether to accept or reject the synchro-command based at least in part on a sender ID and a receiver ID encoded on the synchro-command; and
   schedule execution of the data retrieval control command encoded on an accepted synchro-command based at least in part on a scheduler time encoded on the synchro-command.

8. The device of claim 7, wherein the synchrophasor measurement unit is one of a plurality of synchrophasor measurement units that generated the synchrophasor dataset.

9. The device of claim 7, wherein the data retrieval control command identifies the stored synchrophasor dataset with a start retrieval time and a stop retrieval time, wherein the stored synchrophasor dataset corresponds with the start retrieval time and the stop retrieval time.

10. The device of claim 7, wherein the instruction to schedule execution of the data retrieval control command is to facilitate synchronized execution with other devices in the wide area monitoring system.

11. The device of claim 7, wherein the instructions, when executed by the processor, cause the processor to prioritize scheduling of the data retrieval control command based at least in part on time stamps encoded on the synchro-command.

12. The device of claim 7, wherein the instruction to determine whether to accept or reject the synchro-command includes matching:
   the receiver ID with a device ID; and
   the sender ID with a list of other devices from which the device is allowed to receive synchro-commands.

13. The device of claim 7, comprising instructions that, when executed by the processor, cause the processor to time align and aggregate the synchrophasor datasets, and to map the synchrophasor datasets to protocol specific datasets based at least in part on a protocol utilized by the second device.

14. The device of claim 13, wherein the generated synchrophasor datasets have a sampling rate.

15. The device of claim 7, wherein the device is a relay and the wide area monitoring system is configured to monitor an electrical grid.

* * * * *